US010636686B2

(12) United States Patent
Abel et al.

(10) Patent No.: US 10,636,686 B2
(45) Date of Patent: Apr. 28, 2020

(54) METHOD MONITORING CHAMBER DRIFT

(71) Applicant: Lam Research Corporation, Fremont, CA (US)

(72) Inventors: Joseph Abel, West Linn, OR (US); Purushottam Kumar, Hillsboro, OR (US); Adrien Lavoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/906,332

(22) Filed: Feb. 27, 2018

(65) Prior Publication Data

US 2019/0267268 A1  Aug. 29, 2019

(51) Int. Cl.
*H01L 21/66* (2006.01)
*H01L 21/67* (2006.01)
*H01L 21/02* (2006.01)
*H01L 21/311* (2006.01)
*H01J 37/00* (2006.01)

(52) U.S. Cl.
CPC ........ *H01L 21/67253* (2013.01); *H01J 37/00* (2013.01); *H01L 21/02164* (2013.01); *H01L 21/31116* (2013.01); *H01L 22/10* (2013.01)

(58) Field of Classification Search
CPC .. H01J 37/00; H01J 37/32963; H01J 37/3299; H01L 21/31116; H01L 22/10; H01L 21/67253; H01L 21/02164
See application file for complete search history.

(56) References Cited

U.S. PATENT DOCUMENTS

| 6,537,460 | B1 * | 3/2003 | Shiobara ........... H01J 37/32935 216/59 |
| 6,627,463 | B1 * | 9/2003 | Sarfaty ............... H01L 21/3144 438/7 |
| 6,673,200 | B1 * | 1/2004 | Gu .................... H01J 37/32935 156/345.35 |
| 7,297,287 | B2 * | 11/2007 | Fatke ................ H01J 37/32935 156/345.25 |
| 8,206,996 | B2 | 6/2012 | Kanarik et al. |
| 8,257,503 | B2 * | 9/2012 | Kim .................. H01L 21/67253 134/1.1 |

(Continued)

FOREIGN PATENT DOCUMENTS

| JP | 2010-177480 | 8/2010 |
| JP | 2011-238957 | 11/2011 |
| KR | 10-2018-0004663 | 1/2018 |

OTHER PUBLICATIONS

International Search Report from International Application No. PCT/US2019/018918 dated Jun. 4, 2019.

(Continued)

*Primary Examiner* — Savitri Mulpuri
(74) *Attorney, Agent, or Firm* — Beyer Law Group LLP

(57) ABSTRACT

A method for monitoring drift in a plasma processing chamber for semiconductor processing is provided. A plurality of cycles is provided, wherein each cycle comprises depositing a deposition layer over a chuck in the plasma processing chamber, plasma etching the deposition layer, and measuring a time for plasma etching the deposition layer to etch through the deposition layer. The measured time for plasma etching is used to determine plasma processing chamber drift.

5 Claims, 4 Drawing Sheets

(56) References Cited

U.S. PATENT DOCUMENTS

| | | | | |
|---|---|---|---|---|
| 8,368,308 B2* | 2/2013 | Banna | ............... | H01J 37/321 |
| | | | | 315/111.71 |
| 9,023,666 B2* | 5/2015 | Auth | ............... | H01L 21/3065 |
| | | | | 438/689 |
| 9,502,221 B2* | 11/2016 | Valcore, Jr. | ....... | H01J 37/32926 |
| 10,177,017 B1* | 1/2019 | Yan | ............... | H01L 21/67225 |
| 2004/0147131 A1* | 7/2004 | Kitsunai | ........... | H01J 37/32935 |
| | | | | 438/710 |
| 2004/0263827 A1* | 12/2004 | Xu | ..................... | G01N 21/68 |
| | | | | 356/72 |
| 2007/0224840 A1* | 9/2007 | Renau | ............. | H01J 37/32935 |
| | | | | 438/798 |
| 2009/0030632 A1* | 1/2009 | Tallavarjula | ......... | G01N 21/274 |
| | | | | 702/85 |
| 2009/0130856 A1* | 5/2009 | Shannon | ........... | H01J 37/32174 |
| | | | | 438/710 |
| 2010/0084544 A1* | 4/2010 | Tallavarjula | .............. | G01J 3/28 |
| | | | | 250/252.1 |
| 2010/0332013 A1* | 12/2010 | Choi | ............... | G05B 23/0254 |
| | | | | 700/110 |
| 2014/0272341 A1* | 9/2014 | Duan | ............... | H01L 21/68757 |
| | | | | 428/212 |
| 2019/0019734 A1* | 1/2019 | Jung | ..................... | H01L 22/26 |
| 2019/0185999 A1* | 6/2019 | Shanbhag | ........... | C23C 16/4404 |

OTHER PUBLICATIONS

Written Opinion from International Application No. PCT/US2019/018918 dated Jun. 4, 2019.

* cited by examiner

METHOD MONITORING CHAMBER DRIFT

BACKGROUND

The present disclosure relates to the formation of semiconductor devices. More specifically, the disclosure relates to the formation of semiconductor devices in a plasma processing chamber used for depositing and etching layers.

In semiconductor processing, a blank wafer may be processed and then removed from a chamber to be measured with a metrology tool, in order to determine the condition and performance of the chamber.

SUMMARY

To achieve the foregoing and in accordance with the purpose of the present disclosure, a method for monitoring drift in a plasma processing chamber for semiconductor processing is provided. A plurality of cycles is provided, wherein each cycle comprises depositing a deposition layer over a chuck in the plasma processing chamber, plasma etching the deposition layer, and measuring a time for plasma etching the deposition layer to etch through the deposition layer. The measured time for plasma etching is used to determine plasma processing chamber drift.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Integrated circuit fabricators monitor tool parameters, such as deposition and etch rates to maintain control of the yield. Deposition rates are collected by depositing a material and then ex-situ of the deposition chamber measuring the deposited thickness, or some other parameter, to determine thickness using a metrology tool. Etch rates are determined by loading previously deposited wafers with a known thickness measured by a metrology tool into the etch modules. The wafer is then etched, and measured ex-situ with a metrology tool to determine the amount of material removed. Monitoring the wafer using such test wafers increases the cost, and lowers the utilization of the tools in the factory. Increased monitoring can help catch tool issues quicker, thus resulting in a reduction in lost product. But an increase in monitoring also means less time to run product. Also there is the cost of monitoring the tool with test wafers. A fab needs to either buy or dedicate time on deposition tools to create test wafers for the etch tools. The deposition tools need to give up run space or tool time to run deposition monitoring. There is also the cost of maintaining regeneration loops for re-using wafers.

If factories can monitor tool performance parameters such as flows rates, powers, pressure, etc and correlate them to the etch and deposition rates, this gives a means for the factories to monitor tool health without always running a monitoring test wafer. The downside is that the deposition and etch rates are not known. As a result, shifts in deposition and etch rates by chamber conditioning, tool idle times, contamination are not detected by tool performance parameters.

Figure 1:
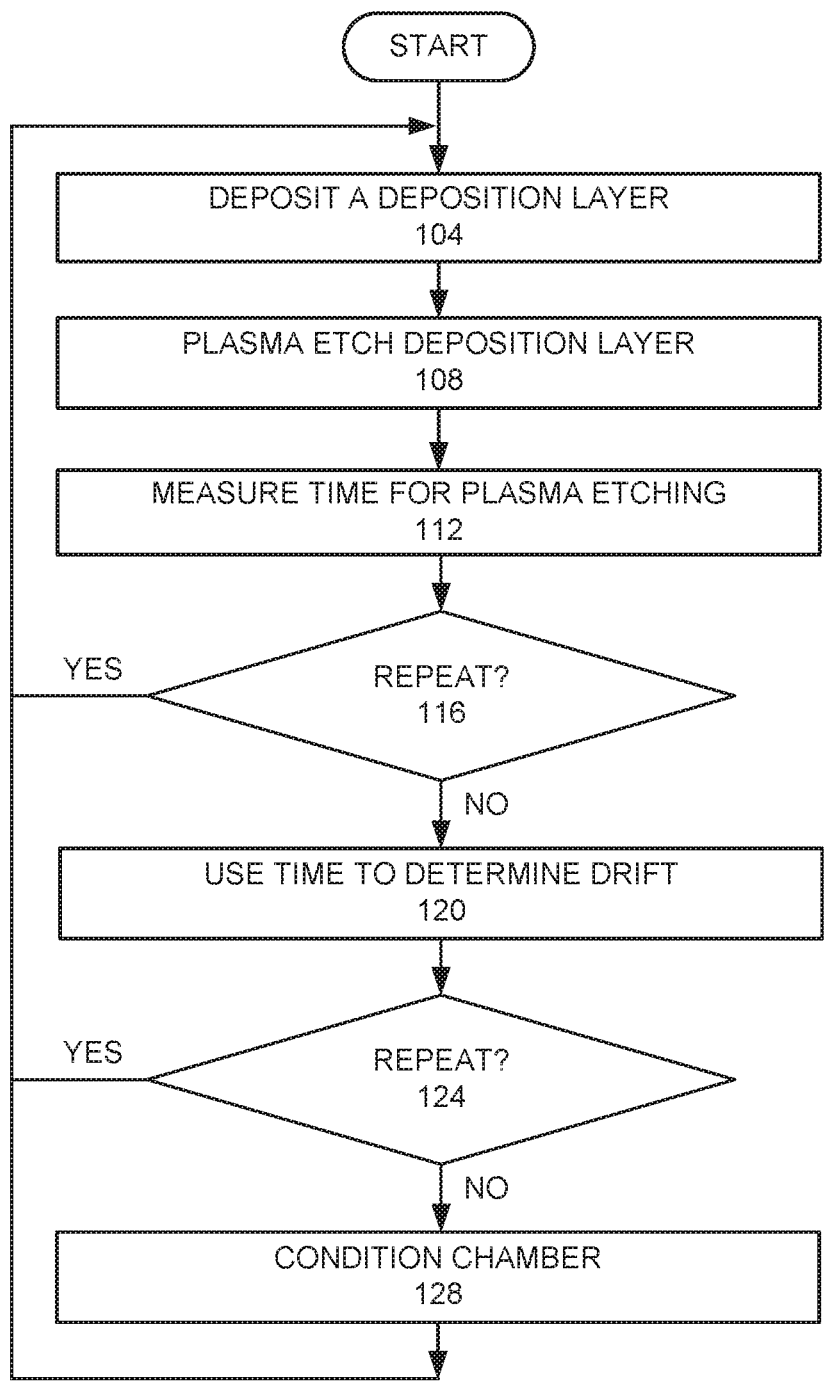
FIG. 1 is a high level flow chart of an embodiment.

To facilitate understanding, FIG. 1 is a high level flow chart of an embodiment. A deposition layer is deposited (step 104). A plasma etch etches the deposition layer (step 108). The time for etching the deposition layer is measured (step 112). Steps 104 to 112 may be repeated one or more times (step 116). The measured time is used to determine plasma processing chamber drift (step 120). Steps 104 to 120 may be repeated one or more times (step 124). When it is determined the plasma processing chamber has drifted too far, the plasma processing chamber is conditioned (step 128).

Examples

Figure 2:
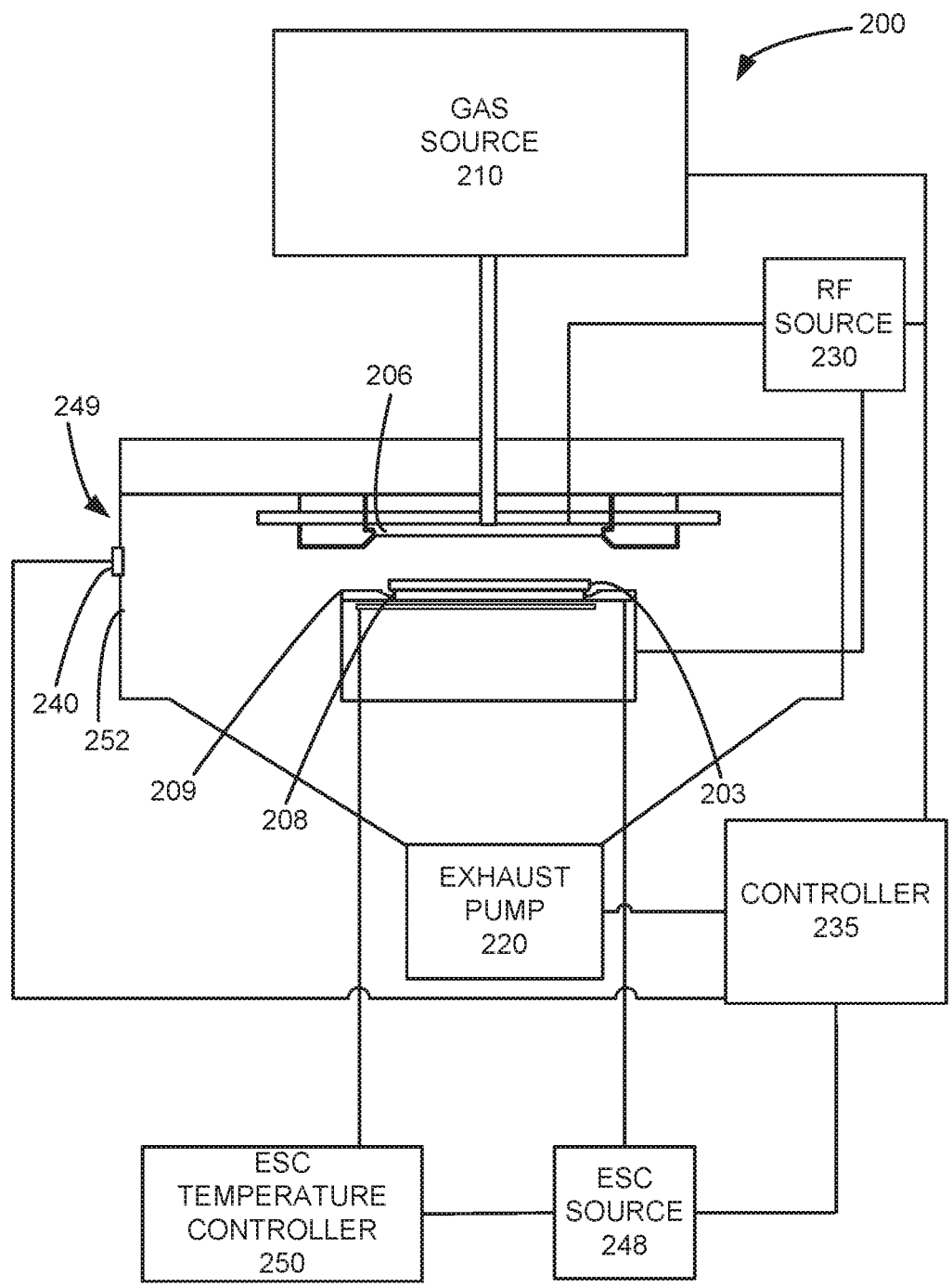
FIG. 2 is a schematic view of a plasma processing chamber that may be used in an embodiment.

FIG. 2 is a schematic view of a plasma processing chamber which may be used in an embodiment. In one or more embodiments, a plasma processing chamber 200 comprises a gas distribution plate 206 providing a gas inlet and an electrostatic chuck (ESC) 208, within a chamber 249, enclosed by a chamber wall 252. Within the chamber 249, a wafer 203 is positioned over the ESC 208, which is a substrate support. An edge ring 209 surrounds the ESC 208. An ESC source 248 may provide a bias to the ESC 208. A gas source 210 is connected to the chamber 249 through the gas distribution plate 206. An ESC temperature controller 250 is connected the ESC 208. A radio frequency (RF) source 230 provides RF power to a lower electrode and/or an upper electrode, which in this embodiment are the ESC 208 and the gas distribution plate 206. In an exemplary embodiment, 400 kHz, 60 MHz, and optionally 2 MHz, 27 MHz power sources make up the RF source 230 and the ESC source 248. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. An optical detector is optically connected to the chamber 249. A controller 235 is controllably connected to the RF source 230, the ESC source 248, an exhaust pump 220, an optical detector 240, and the gas source 210. An example of such a chamber is the Striker™ Oxide system manufactured by Lam Research Corporation of Fremont, Calif.

Figure 3:
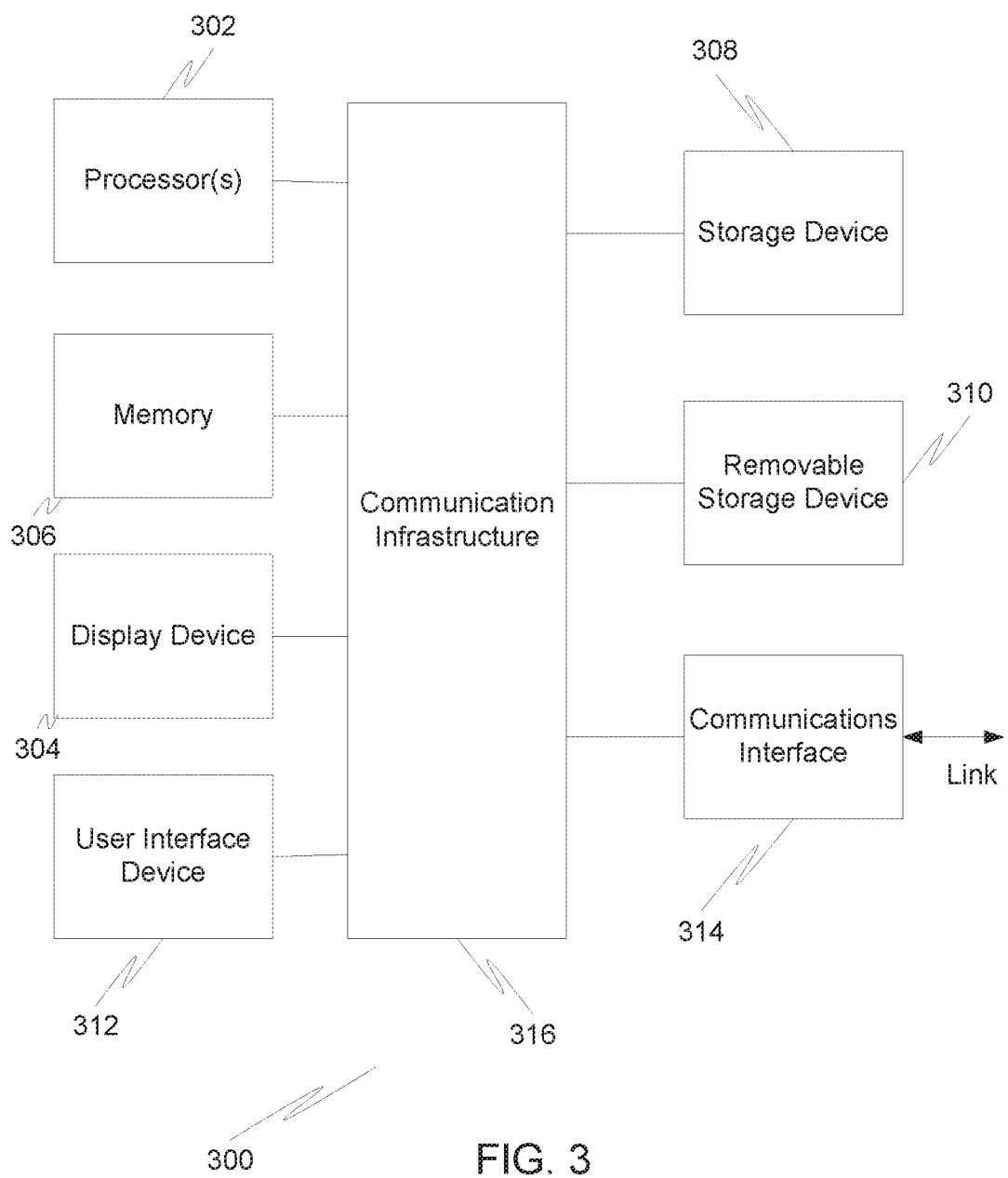
FIG. 3 is a schematic view of a computer system that may be used in practicing an embodiment.

FIG. 3 is a high level block diagram showing a computer system 300, which is suitable for implementing a controller 235 used in embodiments. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communication interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments may execute solely upon the processors or may execute over a network such as the Internet, in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4A:
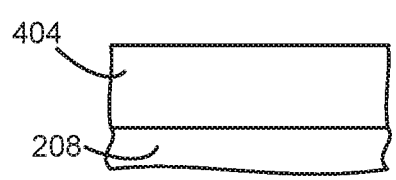
FIGS. 4A-B are cross sectional views of part of the ESC processed according to an embodiment.

In an embodiment, a deposition layer is deposited over a chuck (step 104). In this example, the deposition is done without a wafer in the plasma processing chamber 200. In this example, the deposited layer is silicon oxide. An example recipe for depositing the silicon oxide may first provide a silicon-containing precursor, such as polysilanes ($H_3Si-(SiH_2)_n-SiH_3$), where n≥0, silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. The silicon-containing precursor may be provided to deposit a silicon containing layer. An oxidant is also flowed into the plasma processing chamber 200. The oxidant may comprise one or more of oxygen, water, carbon dioxide, nitrous oxide, or carbon monoxide. In some embodiments, the silicon-containing precursor and the oxidant may be flowed simultaneously. In other embodiments, the silicon-containing precursor and oxidant may be flow sequentially. FIG. 4A is a cross sectional view of part of the ESC 208, where the deposition layer 404 has been deposited directly on the top surface of the ESC 208. In other embodiments, other layers may be between the ESC 208 and the deposition layer 404, where a wafer is not between the ESC 208 and the deposition layer 404.

The deposition layer is plasma etched (step 108). An example of an etch recipe for etching the deposition layer of silicon oxide provides an etchant gas comprising a halogen containing component into the plasma processing chamber 200. The halogen containing component may comprise a fluorine containing component, such as one or more of nitrogen trifluoride ($NF_3$), fluoroform ($CHF_3$), octafluorocyclobutane ($C_4F_8$), and tetrafluoromethane ($CF_4$). The etchant gas is formed into an in-situ plasma in the plasma processing chamber 200, which etches the deposition layer of silicon oxide. When an endpoint is detected, the etching is stopped. This may be done by stopping the flow of the etchant gas or by stopping the RF power, which energizes the plasma.

Figure 4B:

The time for the plasma etching the deposition layer is measured (step 112). In this example, the optical detector 240 uses optical emission spectroscopy (OES) to measure an optical emission spectrum, to determine the time when the deposition layer has been etched through. Optical emission spectroscopy may be used to detect when the concentration of species from the etched silicon oxide decreases or when species from a layer below the silicon oxide increases. In some embodiments, a silicon nitride layer may be between the surface of the ESC 208 and the silicon oxide deposition layer. In such embodiments, the presence of species from the silicon nitride layer may be used to indicate that the silicon oxide deposition layer has been etched through. When an endpoint is detected, the etching is stopped. This may be done by stopping the flow of the etchant gas or by stopping the RF power, which energizes the plasma. FIG. 4B is a cross sectional view of part of the ESC 208, after the deposition layer has been etched.

The depositing the deposition layer (step 104) the plasma etching the deposition layer (step 108) and the measuring the time for the plasma etching (step 112) may be cyclically repeated one or more times (step 116). The measured time is used to determine plasma processing chamber drift (step 120). In this embodiment, after each cycle the measured time is compared to a baseline time. If the measure time is not outside of the threshold distance from the baseline time, then step 104 to step 120 are repeated (step 124). If the measured time is outside of a threshold distance from the baseline time indicating a threshold plasma drift, a flag may be raised to indicate that the plasma processing chamber needs to be conditioned. In such a case, the plasma processing chamber is conditioned (step 128), such as cleaned, in order to obtain an etch time within the threshold distance from the baseline time. Other embodiments may provide a conditioning that cleans a plasma processing chamber 200 and then deposits a layer on parts of the interior of the plasma processing chamber 200. Between each cycle, one or more production wafers may be processed.

In another embodiment, after a plurality of cycles of step 104 to step 116, the plurality of measured times are graphed with respect to the cycle, where the graph is used to determine plasma processing chamber drift (step 120). If the graph does not indicate that the plasma processing chamber needs conditioning, then step 104 to step 120 is repeated (step 124). The graph may show an abrupt change in etching time. Such an abrupt change may indicate a failure of a plasma processing chamber component. The chamber may be repaired. A gradual change in the etching time may indicate a buildup of deposition in the plasma processing chamber, which, at a certain point, may need to be cleaned. The shape of the graph may be used to indicate which type of cleaning and the location of the cleaning that is needed. After conditioning the chamber (step 128), wafers may be processed.

This embodiment allows for the measurement of the plasma processing chamber condition, while minimizing a combination of down time and production wafer defects. The plasma processing chamber condition may be determined quickly reducing or eliminating the need and wait time for a test wafer to be examine ex-situ by a metrology device. In addition, since a test wafer is not used, time needed for loading and unloading the test wafer is eliminated. In addition, the cost of preparing such test wafers is eliminated.

Figure 5A:
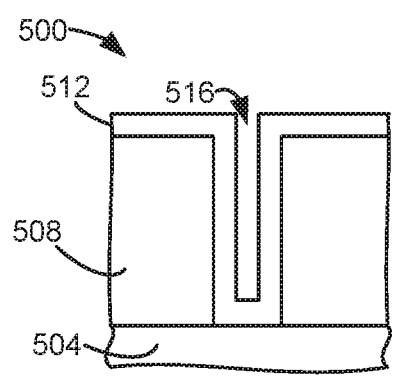
FIGS. 5A-B are cross sectional views of part of a stack processed according to another embodiment.

In another embodiment, a deposition layer is deposited over a chuck (step 104). In this example, the deposition is done with a production wafer in the plasma processing chamber 200. In this example, the deposited layer is silicon nitride over a silicon oxide layer. FIG. 5A is a cross sectional view of part of a stack 500, with a substrate 504 under a silicon oxide layer 508, over which a silicon nitride layer 512 has been deposited. In this example, an etched feature 516 with sidewalls is formed into the silicon oxide layer 508. The etched feature 516 may be a slot or hole or some other type of aperture. The silicon nitride layer 512 is deposited on sidewalls of the etched feature 516 and on horizontal surfaces of the stack. In processing a production wafer, part of the process would be to etch the silicon nitride layer 512 formed on the horizontal surfaces away, leaving only the silicon nitride deposited on the sidewalls. In other embodiments, one or more layers may be between the substrate 504 and the silicon nitride layer 512. In other embodiments, other layers of other materials may be used instead of the silicon nitride layer 512, as long as the endpoint of the etching of the deposition layer may be determined during the etching process.

Figure 5B:
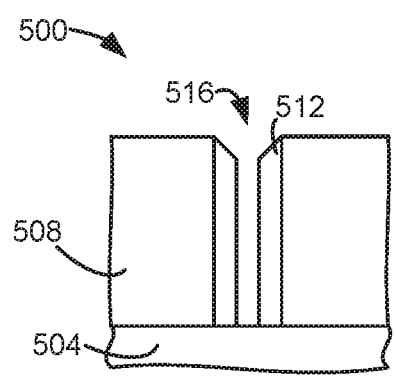

The deposition layer is plasma etched (step 108). FIG. 5B is a cross sectional view of part of the stack 500, after the deposition layer 512 has been etched. The parts of the silicon nitride layer 512 on horizontal surfaces have been etched away, while at least part of the vertical sidewalls remain.

The time for the plasma etching the deposition layer is measured (step 112). In this example, the optical detector 240 is used to for OES, to determine the time when the deposition layer has been etched through. OES may be used to detect when the concentration of species from the etched silicon nitride decreases or when species from the silicon oxide increases.

The depositing of the deposition layer (step 104) the plasma etching the deposition layer (step 108) and the measuring the time for the plasma etching (step 112) may be cyclically repeated one or more times (step 116). For each cycle the production wafer is removed, and a new production wafer is provided. The measured time is used to determine plasma processing chamber drift (step 120). In an embodiment, after a plurality of cycles of step 104 to step 116, the plurality of measured times are graphed, where the graph is used to determine plasma processing chamber drift (step 120). If the graph does not indicate that the plasma processing chamber needs conditioning, then step 104 to step 120 is repeated (step 124). The graph may show an abrupt change in etching time. Such an abrupt change may indicate a failure of a plasma processing chamber component. The chamber may be repaired. A gradual change in the etching time may indicate a buildup of deposition in the plasma processing chamber, which at a certain point may need to be cleaned. The shape of the graph may be used to indicate which type of cleaning and the location of the cleaning that is needed. After conditioning the chamber (step 128), additional production wafers may be processed.

Various embodiments increase through put with a reduction in defective production wafers by reducing or eliminating the need for ex-situ measurements on a metrology tool, while measuring chamber performance more frequently using an in-situ process. By measuring performance more frequently, problems are detected more quickly, reducing the number of defective wafers. Some embodiments do not need test wafers, which reduces costs and testing time. Some embodiments are able to measure how a change in a process parameter affects chamber performance. In another embodiment, a target deposition thickness may be goal in a certain recipe, so that an embodiment may be used in a plasma processing chamber in order to determine a recipe for obtaining the deposition target thickness.

Various embodiments may use different processes to determine when the deposition layer is etched through. In one embodiment, optical emission spectroscopy would be used. In another embodiment, laser interferometry would be used.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for monitoring drift in a plasma processing chamber for semiconductor processing, comprising:
 a plurality of cycles, wherein each cycle comprises:
  depositing a deposition layer over a chuck in the plasma processing chamber, wherein the depositing the deposition layer is performed without a wafer and wherein the depositing the deposition layer deposits the deposition layer directly on a surface of the chuck;
  plasma etching the deposition layer; and
  measuring a time for plasma etching the deposition layer to etch through the deposition layer;
 using the graph to determine chamber condition;
 using the graph to determine if the plasma processing chamber needs repair; and
 using the measured time for plasma etching to determine plasma processing chamber drift, wherein the using the measured time for plasma etching comprises:
  generating a graph of time for plasma etching with respect to each cycle of the plurality of cycles and wherein the using the measured time for plasma etching to determine plasma processing chamber drift; and
  using the measured time for plasma etching to determine when to clean the plasma processing chamber, wherein at least one production wafer is processed between each cycle of the plurality of cycles.

2. The method, as recited in claim 1, wherein the measuring the time for plasma etching the deposition layer uses at least one of optical emission spectroscopy or laser interferometry.

3. The method, as recited in claim 1, wherein the using the measured time for plasma etching comprises comparing the measured time for plasma etching to a baseline time determines if the measured time for plasma etching is outside of a threshold distance from the baseline time.

4. The method, as recited in claim 1, wherein the plasma etching the deposition layer, comprises:
   flowing an etchant gas comprising a halogen containing component into the plasma processing chamber; and
   forming the etchant gas into a plasma in the plasma processing chamber.

5. The method, as recited in claim 1, further comprising conditioning the plasma processing chamber when a drift beyond a threshold is determined.

\* \* \* \* \*